United States Patent
Miyamoto et al.

(10) Patent No.: US 9,502,623 B1
(45) Date of Patent: Nov. 22, 2016

(54) LIGHT EMITTING DEVICE

(71) Applicant: NICHIA CORPORATION, Anan-shi (JP)

(72) Inventors: Kimihiro Miyamoto, Tokushima (JP); Atsushi Bando, Itano-gun (JP); Naofumi Sumitani, Itano-gun (JP); Akira Otani, Komatsushima (JP)

(73) Assignee: NICHIA CORPORATION, Anan-shi (JP)

( * ) Notice: Subject to any disclaimer, the term of this patent is extended or adjusted under 35 U.S.C. 154(b) by 0 days.

(21) Appl. No.: 14/873,336

(22) Filed: Oct. 2, 2015

(51) Int. Cl.
| | |
|---|---|
| *H01L 33/54* | (2010.01) |
| *H01L 25/16* | (2006.01) |
| *H01L 33/48* | (2010.01) |
| *H01L 33/60* | (2010.01) |
| *H01L 33/62* | (2010.01) |
| *H01L 25/075* | (2006.01) |
| *H01L 33/56* | (2010.01) |

(52) U.S. Cl.
CPC .......... *H01L 33/54* (2013.01); *H01L 25/0753* (2013.01); *H01L 25/167* (2013.01); *H01L 33/483* (2013.01); *H01L 33/56* (2013.01); *H01L 33/60* (2013.01); *H01L 33/62* (2013.01)

(58) Field of Classification Search
None
See application file for complete search history.

(56) References Cited

U.S. PATENT DOCUMENTS

| | | | |
|---|---|---|---|
| 2011/0012151 A1 | 1/2011 | Ono | |
| 2012/0098006 A1* | 4/2012 | Chen | H01L 33/486 257/98 |

FOREIGN PATENT DOCUMENTS

JP  2011-023557  2/2011

* cited by examiner

*Primary Examiner* — Fei Fei Yeung Lopez
(74) *Attorney, Agent, or Firm* — Mori & Ward, LLP

(57) ABSTRACT

A light emitting device includes a base structure, a wall, a light emitting element, a protection element, and a light reflective portion. The wall includes an inner peripheral surface defining an opening. The opening has a substantially polygonal shape in a planar view of the light emitting device. The light reflective portion has a maximum length which is longest in the light reflective portion. The maximum length is defined at a maximum-length position closest to the first corner among a plurality of positions defined in the light reflective portion. The light reflective portion has a minimum length which is shortest in the light reflective portion. The minimum length is defined at a minimum-length position arranged apart from the maximum-length position. The light reflective portion includes an inclined surface extending from the maximum-length position to the minimum-length position.

42 Claims, 13 Drawing Sheets

LIGHT EMITTING DEVICE

BACKGROUND OF THE INVENTION

1. Field of the Invention

The present invention relates to a light emitting device.

2. Discussion of the Background

A light emitting device including a light emitting element such as a light emitting diode (LED) has been known.

SUMMARY OF THE INVENTION

According to one aspect of the present invention, a light emitting device includes a base structure, a wall, a light emitting element, a protection element, and a light reflective portion. The base structure includes a first surface. The wall is provided on the first surface of the base structure. The wall includes an inner peripheral surface defining an opening. The opening has a substantially polygonal shape in a planar view of the light emitting device. The substantially polygonal shape includes a first corner, a second corner, a third corner, and a fourth corner. The light emitting element is provided in the opening in the planar view and provided on the first surface. The protection element is provided in the opening in the planar view and provided on the first surface. The protection element is closer to the first corner than to each of the second corner, the third corner, and the fourth corner in the planar view. The light reflective portion covers the protection element. The light reflective portion is provided on the first surface. The light reflective portion has a maximum length which is defined from the first surface in a first direction and which is longest in the light reflective portion. The first direction is substantially perpendicular to the first surface. The maximum length is defined at a maximum-length position closest to the first corner among a plurality of positions defined in the light reflective portion. The light reflective portion has a minimum length which is defined from the first surface in the first direction and which is shortest in the light reflective portion. The minimum length is defined at a minimum-length position arranged apart from the maximum-length position. The light reflective portion includes an inclined surface extending from the maximum-length position to the minimum-length position.

According to another aspect of the present invention, a light emitting device includes a base structure, a wall, a light emitting element, a protection element, and a light reflective portion. The base structure includes a first surface. The wall is provided on the first surface of the base structure. The wall including an inner peripheral surface defining an opening, the opening having a substantially polygonal shape in a planar view of the light emitting device, the substantially polygonal shape including a first corner, a second corner, a third corner, and a fourth corner, the second corner having a shape different from a shape of each of the first corner, the third corner, and the fourth corner. The light emitting element is provided in the opening in the planar view. The protection element is provided in the opening in the planar view. The light reflective portion covers the protection element to reflect light emitted from the light emitting element. The light reflective portion has a maximum length which is defined from the first surface in the first direction and which is longest in the light reflective portion. The maximum length is defined at a position closest to the first corner among a plurality of positions defined in the light reflective portion. The light reflective portion has a minimum length which is defined from the first surface in the first direction and which is shortest in the light reflective portion. The minimum length is defined at a minimum-length position arranged apart from the maximum-length position. The light reflective portion includes an inclined surface extending from the maximum-length position to the minimum-length position.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE EMBODIMENTS

Figure 1:
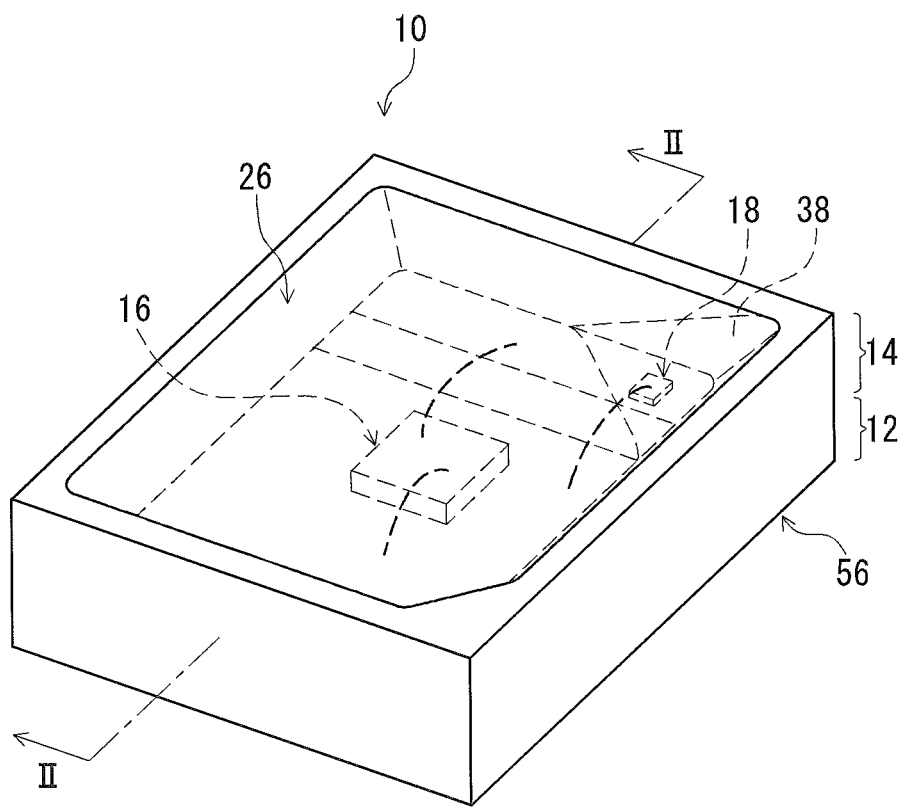
FIG. 1 is a perspective view of a light emitting device in accordance with a first embodiment.
Figure 1:
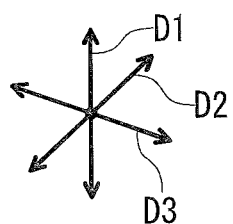

The embodiments will now be described with reference to the accompanying drawings, wherein same reference numerals designate corresponding or identical elements throughout the various drawings.

First Embodiment

Figure 2:
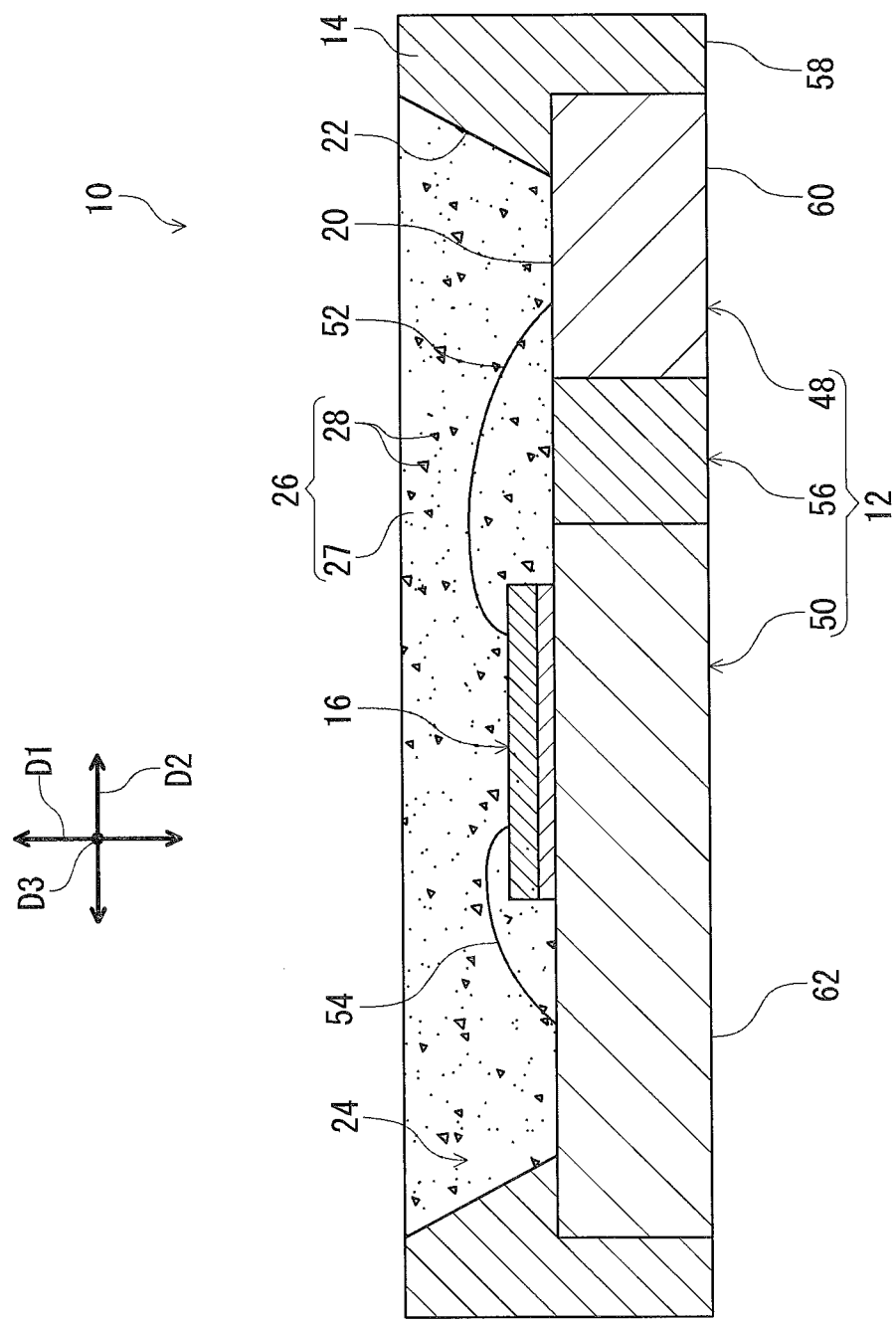
FIG. 2 is a cross-sectional view of the light emitting device taken along line II-II of FIG. 1.

Referring initially to FIG. 1, a light emitting device 10 in accordance with a first embodiment includes a base structure 12, a wall 14, a light emitting element 16, and a protection element 18. As seen in FIG. 2, the base structure 12 includes a first surface 20. The wall 14 is provided on the first surface 20 of the base structure 12 in a first direction D1 substantially perpendicular to the first surface 20. The wall 14 includes an inner peripheral surface 22 defining an opening 24. The light emitting element 16 is configured to emit light. Specifically, the light emitting element 16 is configured to convert electrical power to light. Examples of the light emitting element 16 include a light emitting diode (LED). Examples of the LED include a laminated structure including a light emitting layer made of a nitride semiconductor such as InN AlN, GaN, InGaN, AlGaN, and InGaAlN, a III-V compound semiconductor, a II-V compound semiconductor, and other various semiconductor layers formed on a substrate. Examples of the substrate include an insulating substrate such as sapphire (Al$_2$O$_3$), and a conductive substrate such as SiC, GaN, and GaAs. The light emitting element 16 may not include the substrate. While the light emitting element 16 is described as the LED in the illustrated embodiment, the light emitting element 16 can have other constructions.

As seen in FIG. 1, the protection element 18 is configured to electrically protect the light emitting element 16. Examples of the protection element 18 include a Zener diode, a capacitor, a varistor, and a bridge diode. While the protection element 18 is described as the Zener diode in the illustrated embodiment, the protection element 18 can have other constructions.

As seen in FIGS. 1 and 2, the light emitting device 10 further includes a sealing member 26 filled in the opening 24 to cover the light emitting element 16. In the illustrated embodiment, the sealing member 26 is filled in the opening 24 to cover the light emitting element 16, the inner peripheral surface 22 of the wall 14, and the protection element 18. The sealing member 26 has optical light-transmissiveness. For example, the sealing member 26 includes an optical light transmissive member 27 made of an optical light transmissive material such as a silicone resin, a modified silicone resin, an epoxy resin, a modified epoxy resin, a phenol resin, a polycarbonate resin, an acrylic resin, a TPX resin, a polynorbornene resin, or a hybrid resin which contains one or more of those resins. As seen in FIG. 2, the sealing member 26 further includes wavelength converting materials 28 provided in the optical light transmissive member 27. The wavelength converting materials 28 are configured to absorb light emitted from the light emitting element 16 and to emit light having different wavelengths. The wavelength converting materials 28 such as fluorescent particles.

The fluorescent particles absorb at least part of primary light emitted from the light emitting element 16 and emit light having a wavelength different from a wavelength of the primary light. Specifically, examples of the fluorescent particles include yttrium aluminum garnet (YAG) activated by cerium, nitrogen-containing calcium aluminosilicate activated by europium and/or chromium, sialon activated by europium, silicate activated by europium, and potassium silicate fluoride activated by manganese. Diffusing agent and/or coloring agent can be used as the sealing member 26 along with the fluorescent particles. Specifically, silica, oxidized titanium, magnesium oxide, magnesium carbonate, magnesium hydroxide, calcium carbonate, calcium hydroxide, calcium silicate, zinc oxide, barium titanate, aluminum oxide, iron oxide, chromium oxide, manganese oxide, glass, and carbon black.

Figure 3:
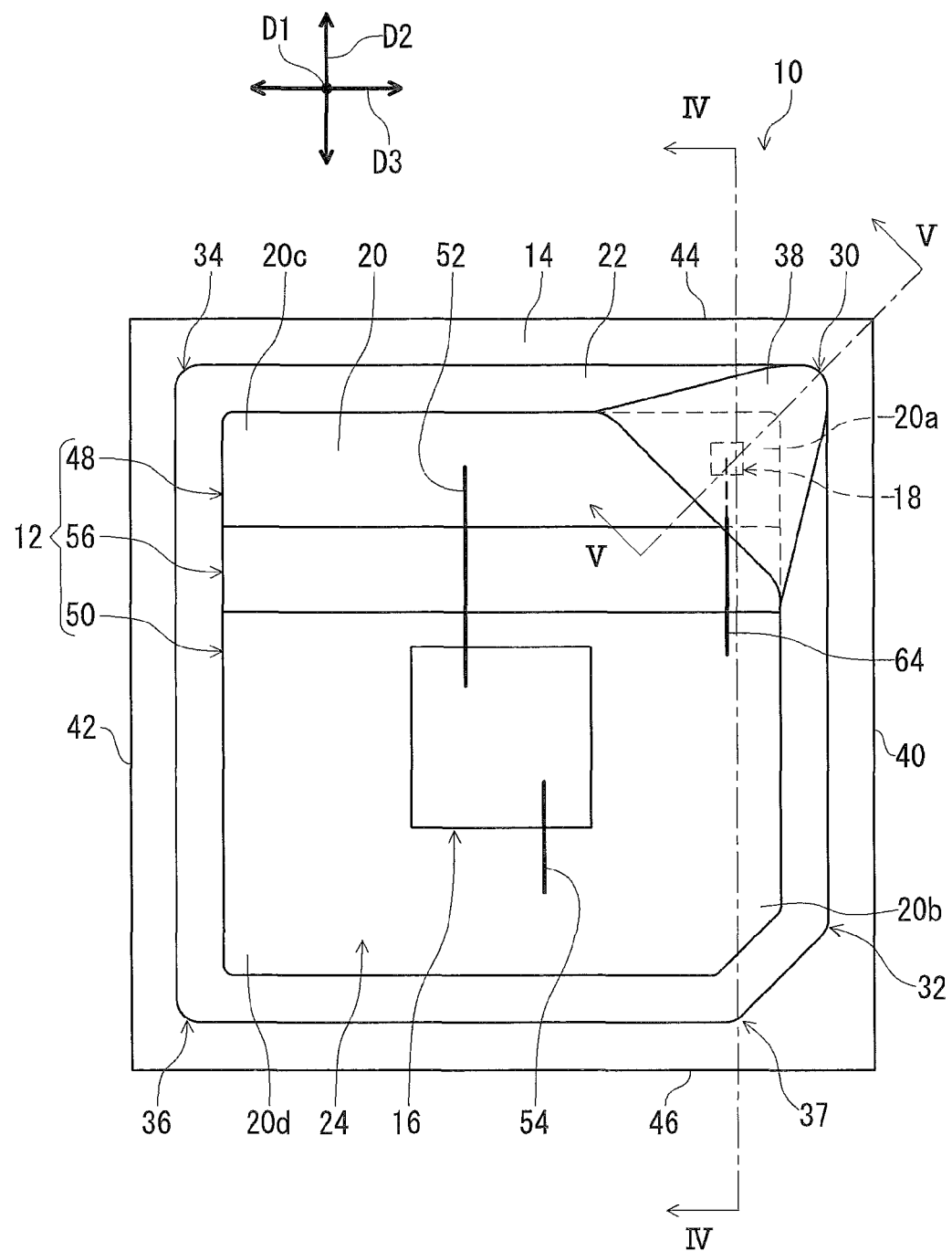
FIG. 3 is a plan view of the light emitting device illustrated in FIG. 1.

In FIG. 3, the sealing member 26 is omitted from the light emitting device 10. As seen in FIG. 3, the light emitting element 16 is provided in the opening 24 in a planar view of the light emitting device 10 (e.g., when viewed from the first direction D1) (FIG. 2). The protection element 18 is provided in the opening 24 in the planar view (FIG. 2) and is provided on the first surface 20. The opening 24 has a substantially polygonal shape in the planar view (FIG. 2). The substantially polygonal shape includes a first corner 30, a second corner 32, a third corner 34, and a fourth corner 36. In this embodiment, the opening 24 has a substantially pentagonal shape. Specifically, the substantially polygonal shape includes the first corner 30, the second corner 32, the third corner 34, the fourth corner 36, and a fifth corner 37. However, the substantially polygonal shape is not limited to the illustrated embodiment.

The second corner 32 is closer to the fifth corner 37 than the first corner 30, the third corner 34, and the fourth corner 36. The fifth corner 37 is closer to the second corner 32 than the first corner 30, the third corner 34, and the fourth corner 36.

In the illustrated embodiment, the protection element 18 is closer to the first corner 30 than to each of the second corner 32, the third corner 34, and the fourth corner 36 in the planar view. The light emitting element 16 is closer to the second corner 32 than the protection element 18 in the planar view. However, the light emitting element 16 can be farther from the second corner 32 than the protection element 18 in the planar view.

As seen in FIG. 3, the first corner 30, the third corner 34, and the fourth corner 36 have the same shape as each other. Each of the first corner 30, the third corner 34, and the fourth corner 36 forms a right angle and has a round shape. At least one of the first corner 30, the third corner 34, and the fourth corner 36 can have a shape different from another corner. At least one of the first corner 30, the third corner 34, and the fourth corner 36 can have shapes other than the round shape.

The second corner 32 has a shape different from a shape of each of the first corner 30, the third corner 34, and the fourth corner 36. The second corner 32 forms an obtuse angle and has a round shape. The fifth corner 37 has a shape different from the shape of each of the first corner 30, the third corner 34, and the fourth corner 36. The fifth corner 37 forms an obtuse angle and has a round shape. Since the second corner 32 and the fifth corner 37 has a shape different from the shape of each of the first corner 30, the third corner 34, and the fourth corner 36, it is possible to easily determine an anode side and a cathode side of the light emitting device 10. However, at least one of the second corner 32 and the fifth corner 37 can have the same shape as those of the first corner 30, the third corner 34, and the fourth corner 36.

As seen in FIG. 3, the light emitting device 10 includes a light reflective portion 38. The light reflective portion 38 covers the protection element 18 to reflect light emitted from the light emitting element 16. The light reflective portion 38 is provided on the first surface 20. In the illustrated embodiment, the light reflective portion 38 entirely covers the protection element 18 to reflect light emitted from the light emitting element 16. However, the light reflective portion 38 can partially cover the protection element 18 to reflect light emitted from the light emitting element 16.

The light reflective portion 38 covers the inner peripheral surface 22 to reflect light emitted from the light emitting element 16. In the illustrated embodiment, the light reflective portion 38 partially covers the inner peripheral surface 22 to reflect light emitted from the light emitting element 16. However, the light reflective portion 38 can entirely cover the inner peripheral surface 22 to reflect light emitted from the light emitting element 16.

The first surface 20 includes a first area 20a, a second area 20b, a third area 20c, and a fourth area 20d. The first area 20a is adjacent to the first corner 30. The second area 20b is adjacent to the second corner 32. The third area 20c is adjacent to the third corner 34. The fourth area 20d is adjacent to the fourth corner 36. While the light reflective portion 38 covers the first area 20a in the illustrated embodiment, the light reflective portion 38 does not cover the second area 20b, the third area 20c, and the fourth area 20d. However, the light reflective portion 38 can cover at least one of the second area 20b, the third area 20c, and the fourth area 20d in addition to or instead of the first area 20a.

As seen in FIG. 3, the light emitting device 10 and the base structure 12 has a substantially square shape in the planar view. The substantially square shape includes a first side 40, a second side 42, a third side 44, and a fourth side 46. The first side 40 extends in a second direction D2 perpendicular to the first direction D1 (FIG. 1). The second side 42 extends in the second direction D2. The second side 42 is opposite to the first side 40 in a third direction D3 perpendicular to each of the first direction D1 and the second direction D2. The third side 44 extends in the third direction D3 between the first side 40 and the second side 42. The fourth side 46 extends in the third direction D3 between the first side 40 and the second side 42. The fourth side 46 is opposite to the third side 44 in the second direction D2.

The first side 40 is substantially parallel to the second side 42. The third side 44 is substantially parallel to the fourth side 46. In the illustrated embodiment, the first side 40, the second side 42, the third side 44, and the fourth side 46 have lengths substantially equal to each other. However, each of the first side 40 and the second side 42 can have a length different from a length of each of the third side 44 and the fourth side 46.

As seen in FIG. 3, the first corner 30 is closer to the first side 40 than to the second side 42 in the third direction D3 in the planar view. The first corner 30 is closer to the third side 44 than to the fourth side 46 in the second direction D2 in the planar view. The second corner 32 is closer to the first side 40 than to the second side 42 in the third direction D3 in the planar view. The second corner 32 is closer to the fourth side 46 than to the third side 44 in the second direction D2 in the planar view.

The third corner 34 is closer to the second side 42 than to the first side 40 in the third direction D3 in the planar view. The third corner 34 is closer to the third side 44 than to the fourth side 46 in the second direction D2 in the planar view. The fourth corner 36 is closer to the second side 42 than to the first side 40 in the third direction D3 in the planar view. The fourth corner 36 is closer to the fourth side 46 than to the third side 44 in the second direction D2 in the planar view. The arrangement of the first corner 30, the second corner 32, the third corner 34, and the fourth corner 36 is not limited to the illustrated embodiment.

As seen in FIG. 3, the protection element 18 is closer to the first side 40 than to the second side 42 in the third direction D3 in the planar view. The protection element 18 is closer to the third side 44 than to the fourth side 46 in the second direction D2 in the planar view. The light emitting element 16 is closer to the fourth side 46 than to the third side 44 in the second direction D2 in the planar view. The light emitting element 16 is provided at a center between the first side 40 and the second side 42 in the third direction D3. The arrangement of the light emitting element 16 is not limited to the illustrated embodiment.

As seen in FIGS. 2 and 3, the base structure 12 includes a first electrode 48 and a second electrode 50. The first electrode 48 is electrically connected to the light emitting element 16. The second electrode 50 is electrically connected to the light emitting element 16. In the illustrated embodiment, the first electrode 48 is an anode electrode, and the second electrode 50 is a cathode electrode. The first electrode 48 is made of an electrically conductive material such as a metallic material. The second electrode 50 is made of an electrically conductive material such as a metallic material. The first electrode 48 is electrically connected to the light emitting element 16 via a conductive wire 52. The second electrode 50 is electrically connected to the light emitting element 16 via a conductive wire 54.

As seen in FIG. 2, the base structure 12 includes a base portion 56 in which each of the first electrode 48 and the second electrode 50 is partially embedded. The second electrode 50 is spaced apart from the first electrode 48 in the second direction D2 perpendicular to the first direction D1. The base portion 56 is partially provided between the first electrode 48 and the second electrode 50 in the second direction D2. In the illustrated embodiment, the base portion 56 is integrally provided with the wall 14 as a single unitary member. However, the base portion 56 can be a separate member from the wall 14.

A plating is preferably provided on surfaces of the first electrode 48 and the second electrode 50 to efficiently extract light emitted from the light emitting element 16. In such an embodiment, the light reflective portion 38 preferably has a reflectance higher than a reflectance of the plating. Examples of materials of the plating include Ni, Pd, Au, Ag, and an alloy of these. The reflectance, as used herein, means an average of reflectances with respect to all wavelengths of light which is emitted from the light emitting element 16. Thus, an average of reflectances of the light reflective portion 38 with respect to all wavelengths of the light emitted from the light emitting element 16 is higher than an average of reflectances of the plating with respect to all wavelengths of the light emitted from the light emitting element 16.

As seen in FIGS. 2 and 3, the first electrode 48 and the second electrode 50 define the first surface 20. In the illustrated embodiment, the base portion 56, the first electrode 48, and the second electrode 50 define the first surface 20. The light emitting element 16 is provided on the second electrode 50. The light emitting element 16 is mounted to the second electrode 50 via an adhesive layer (not shown).

As seen in FIG. 3, the first corner 30 is closer to the first electrode 48 than to the second electrode 50 in the planar view. The second corner 32 is closer to the second electrode 50 than to the first electrode 48 in the planar view. The third corner 34 is closer to the first electrode 48 than to the second electrode 50 in the planar view. The fourth corner 36 is closer to the second electrode 50 than to the first electrode 48 in the planar view.

As seen in FIG. 2, the base structure 12 includes a second surface 58 opposite to the first surface 20 in the first direction D1. The base portion 56, the first electrode 48, the second electrode 50 and the wall 14 define the second surface 58. The first electrode 48 includes a first mounting surface 60 to which electrical power is supplied from an electrical power source (not shown). For example, the first mounting surface 60 is joined to a secondary mounting surface. The second electrode 50 includes a second mounting surface 62 to which electrical power is supplied from the electrical power source (not shown). The first mounting surface 60 and the second mounting surface 62 are opposite to the first surface 20 in the first direction D1. The first mounting surface 60 and the second mounting surface 62 partially constitute the second surface 58.

Figure 4:
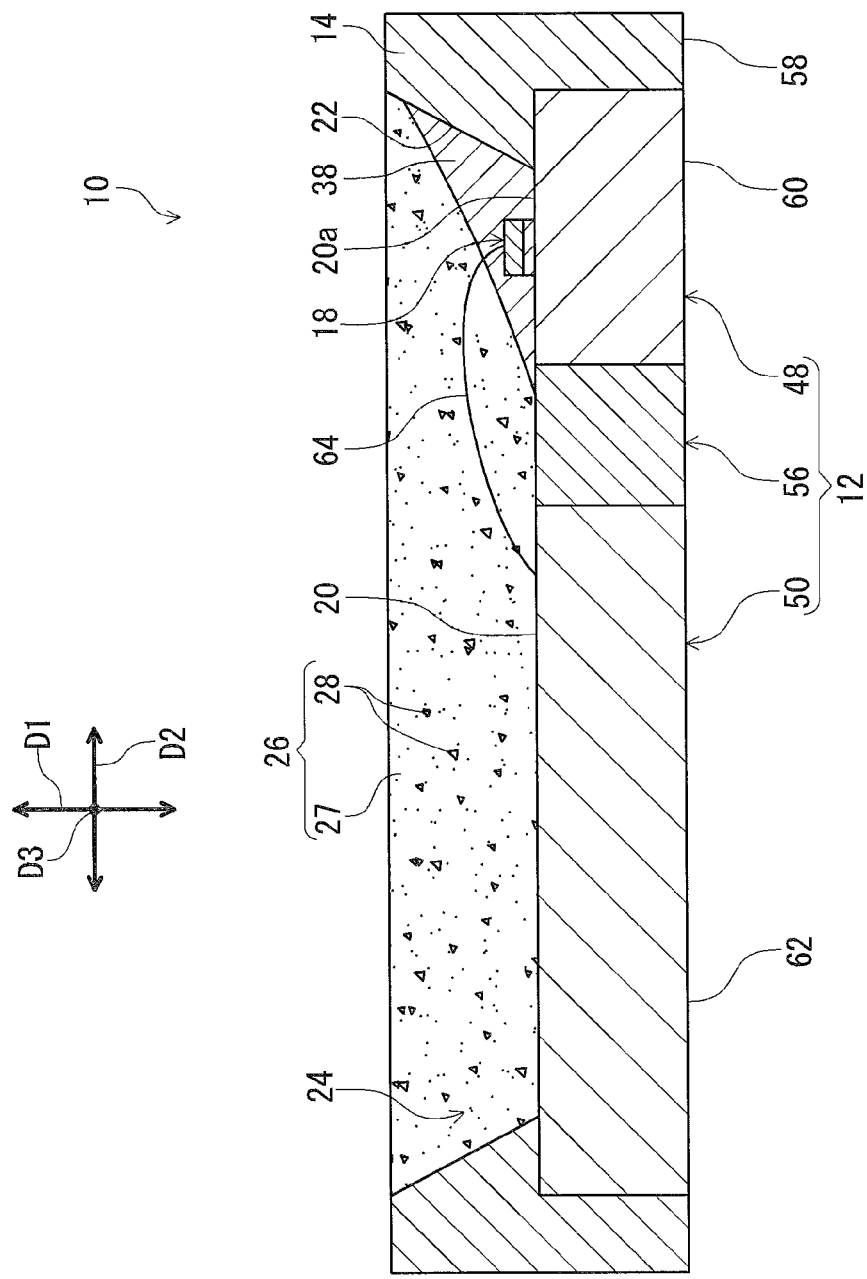
FIG. 4 is a cross-sectional view of the light emitting device taken along line IV-IV of FIG. 3.

As seen in FIG. 4, the protection element 18 is provided on the first electrode 48. For example, the protection element 18 is fixed and electrically connected to the first electrode 48 via a conductive adhesive material (not shown). The protection element 18 is electrically connected to the second electrode 50 via a conductive wire 64. The conductive wire 64 is electrically connected to the protection element 18 and is partially covered with the light reflective portion 38. The conductive wire 64 is partially exposed from the light reflective portion 38.

As seen in FIGS. 2 and 4, the light reflective portion 38 covers the first electrode 48. In the illustrated embodiment, the light reflective portion 38 partially covers the first electrode 48. The light reflective portion 38 is made of a first material. The wall 14 is made of a second material. Since the wall 14 is integrally provided with the base portion 56 as a single unitary member, the base portion 56 is made of the second material.

The first material has a reflectance higher than a reflectance of the second material with respect to wavelengths from 360 nm to 740 nm. For example, a total number of light scattering particles (e.g., titanium oxide) contained in the first material is greater than a total number of light scattering particles contained in the second material. The total number of the light scattering particles contained in the first material is preferably more than one and a half times as great as the total number of the light scattering particles contained in the second material. The total number of the light scattering particles contained in the first material is more preferably more than twice as great as the total number of the light scattering particles contained in the second material. Furthermore, the total number of the light scattering particles contained in the first material is more preferably more than two and a half times as great as the total number of the light scattering particles contained in the second material. For example, the first material contains titanium oxide of 40 wt. %, and the second material contains titanium oxide from 15 wt. % to 20 wt. %.

It is preferable to use, as a base material of the first material, a resin material having high color fastness to light and/or heat. In particular, a part which directly receives light and/or hear from the light emitting element 16 is likely to discolor. Thus, it is preferable to use silicone resin having high color fastness as the resin material which is the base material of the first material, for example.

In the illustrated embodiment, the first material is different from the second material. The first material has a reflectance different from a reflectance of the second material. However, the first material has a reflectance equal to a reflectance of the second material.

Each of the first material and the second material contains a resin material and a reflective material. Examples of a resin material include several resin materials such as thermosetting resin and thermoplastic resin. Specifically, silicone resin, epoxy resin, phenolic resin, fluorine resin, polyolefin resin, polynorbornene resin, bismaleimide triazine (BT) resin, polyphthalamide (PPA), polyethylene terephthalate (PET), polybutylene terephthalate (PBT). Especially, the silicone resin is preferably used since the silicone resin is superior in electric insulation, heat resistance, and light resistance and has good adhesiveness to a metallic material such as the first electrode 48 and the second electrode 50. Examples of the reflective material include titanate (e.g., $K_2TiO_3$), oxidized titanium (e.g., $TiO_2$), oxidized aluminum ($Al_2O_3$), aluminum nitride (e.g., AlN), composite of aluminum and silicon dioxide (e.g., $SiO_2$), zirconia dioxide, boron nitride, and mullite. For example, each of the first material and the second material having the above features has a white color. For example, the reflective material has a refractive index which is equal to or higher than 1.8. To effectively scatter light, the refractive index of the reflective material is preferably equal to or higher than 2.0, more preferably equal to or higher than 2.5. Furthermore, for example, difference between a refractive index of the first material and a refractive index of the second material is equal to or larger than 0.4. To effectively scatter light, the difference is preferably equal to or larger than 0.7, more preferably equal to or larger than 0.9.

Figure 5:
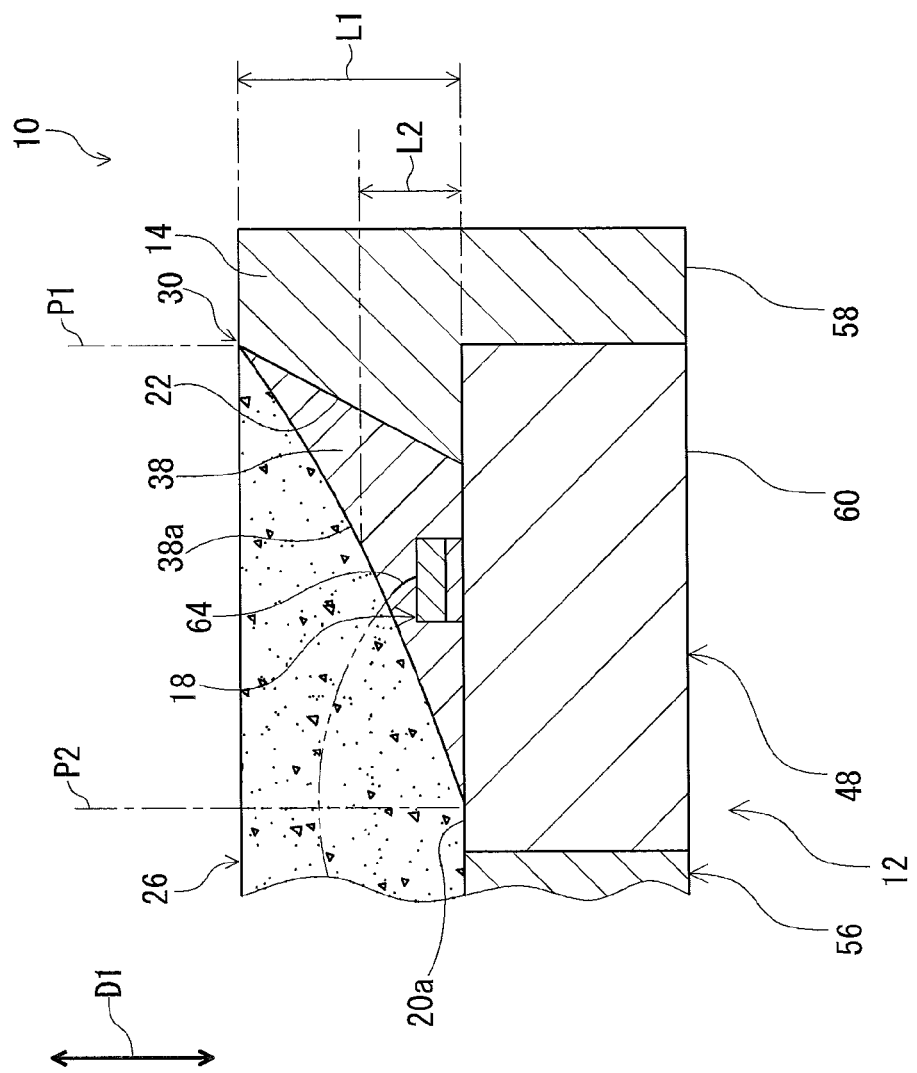
FIG. 5 is a partial cross-sectional view of the light emitting device taken along line V-V of FIG. 3.

As seen in FIG. 5, the light reflective portion 38 has a maximum length L1 which is defined from the first surface 20 in the first direction D1 and which is longest in the light reflective portion 38. In the light reflective portion 38 of this embodiment, the maximum length L1 is defined at a maximum length position P1 closest to the first corner 30 among a plurality of positions defined in the light reflective portion 38. In this embodiment, the maximum length L1 is equal to a height of the wall portion 14 defined in the first direction D1.

The light reflective portion 38 has a minimum length which is defined from the first surface 20 in the first direction D1 and which is shortest in the light reflective portion 38. In the light reflective portion 38 of this embodiment, the minimum length is defined at a minimum-length position P2 arranged apart from the maximum-length position P1. In this embodiment, the minimum length is zero.

The light reflective portion 38 includes an inclined surface 38a extending from the maximum length position P1 to the minimum-length position P2. The inclined surface 38a has a curved shape. However, the inclined surface 38a can have other shapes such as a flat shape. The light reflective portion 38 has a length L2 defined in the first direction D1. The length L2 of the light reflective portion 38 gradually decreases from the maximum-length position P1 to the minimum-length position P2.

With the light emitting device 10, the light reflective portion 38 covers the protection element 18. Accordingly, it is possible to reduce an amount of light absorbed by the protection element 18, improving the light-emitting efficiency of the light emitting device 10. Furthermore, the protection element 18 is closer to the first corner 30 than to each of the second corner 32, the third corner 34, and the fourth corner 36 in the planar view. Accordingly, it is possible to effectively utilize a space in the opening 24, expanding the design possibility of the light emitting device 10 with improving the light-emitting efficiency of the light emitting device 10.

Second Embodiment

A light emitting device 210 in accordance with a second embodiment will be described below referring to FIG. 6. The light emitting device 210 has the same construction as the light emitting device 10 of the first embodiment except for the arrangement of the protection element 18 and the light reflective portion 38. Thus, elements having substantially the same function as those in the first embodiment will be numbered the same here, and will not be described and/or illustrated again in detail here for the sake of brevity.

Figure 6:
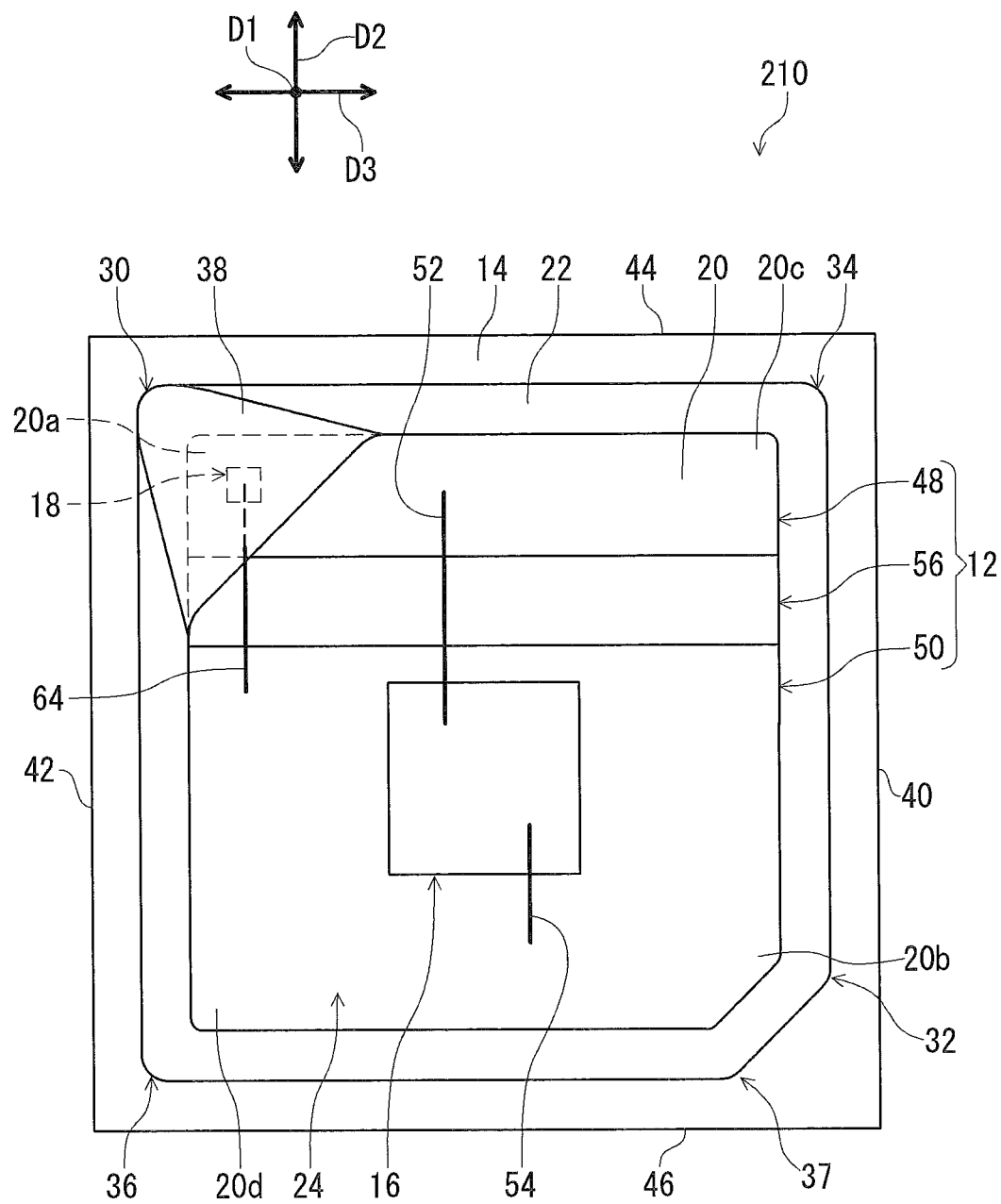
FIG. 6 is a plan view of a light emitting device in accordance with a second embodiment.

As seen in FIG. 6, the second corner 32 is closer to the first side 40 than to the second side 42 in the third direction D3 in the planar view. Unlike the light emitting device 10 in accordance with the first embodiment, however, the first corner 30 and the third corner 34 switch positions with each other in the light emitting device 210. Specifically, the first corner 30 is closer to the second side 42 than to the first side 40 in the third direction D3 in the planar view. The third corner 34 is closer to the first side 40 than to the second side 42 in the third direction D3 in the planar view.

The protection element 18 is closer to the first corner 30 than to each of the second corner 32, the third corner 34, and the fourth corner 36 in the planar view. The protection element 18 is closer to the second side 42 than to the first side 40 in the third direction D3 in the planar view.

With the light emitting device 210, it is possible to obtain substantially the same advantageous effects as those of the light emitting device 10 in accordance with the first embodiment.

Third Embodiment

A light emitting device 310 in accordance with a third embodiment will be described below referring to FIG. 7. The light emitting device 310 has the same construction as the light emitting device 10 of the first embodiment except for a total number of light emitting elements. Thus, elements having substantially the same function as those in the above embodiments will be numbered the same here, and will not be described and/or illustrated again in detail here for the sake of brevity.

Figure 7:
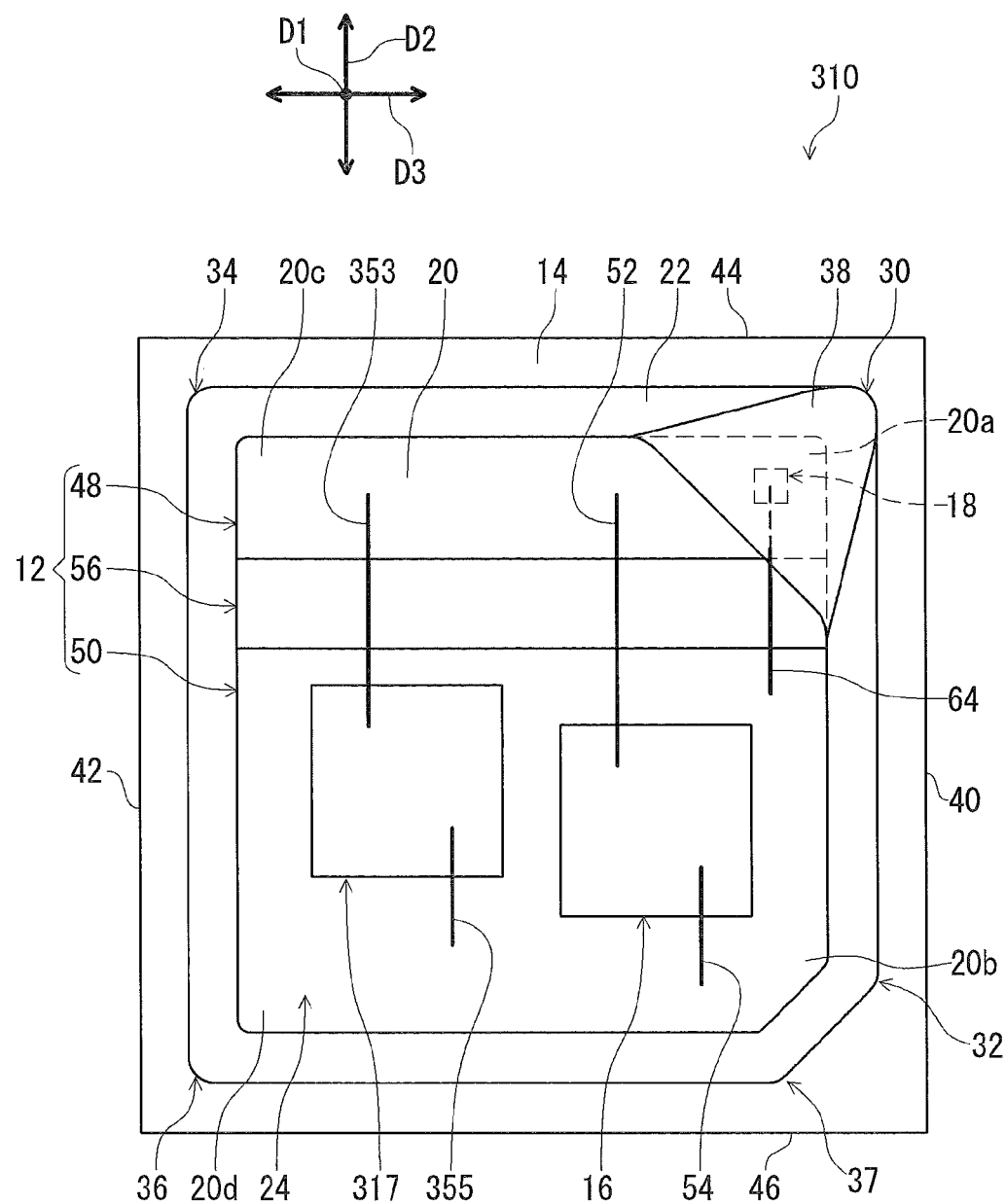
FIG. 7 is a plan view of a light emitting device in accordance with a third embodiment.

As seen in FIG. 7, the light emitting device 310 further includes an additional light emitting element 317 configured to emit light in addition to the light emitting element 16. The additional light emitting element 317 is provided in the opening 24 in the planar view. The first electrode 48 is electrically connected to the additional light emitting element 317 via a conductive wire 353. The second electrode 50 is electrically connected to the additional light emitting element 317 via a conductive wire 355.

The protection element 18 is closer to the first corner 30 and the third side 43 than each of the light emitting element 16 and the additional light emitting element 317 in the planar view. At least one of the light emitting element 16 and the additional light emitting element 317 is closer to the second corner 32 and the fourth side 46 than the protection element 18 in the planar view. In the illustrated embodiment, the light emitting element 16 and the additional light emitting element 317 are closer to the second corner 32 than the protection element 18 in the planar view. The light emitting element 16 is offset from the additional light emitting element 317 in the planar view.

As seen in FIG. 7, the light emitting element 16 is preferably offset from the additional light emitting element 317 in the second direction D2 and/or the third direction D3 in the planer view. This arrangement reduces an amount of light which is incident from one of the light emitting element 16 and the additional light emitting element 317 to the other of the light emitting element 16 and the additional light emitting element 317, improving the light-emitting efficiency of the light emitting device 10.

With the light emitting device 310, it is possible to obtain substantially the same advantageous effects as those of the light emitting device 10 in accordance with the first embodiment.

Fourth Embodiment

A light emitting device 410 in accordance with a fourth embodiment will be described below referring to FIG. 8. The light emitting device 410 has the same construction as the light emitting device 10 of the first embodiment except for the light reflective portion 38. Thus, elements having substantially the same function as those in the above embodiments will be numbered the same here, and will not be described and/or illustrated again in detail here for the sake of brevity.

Figure 8:
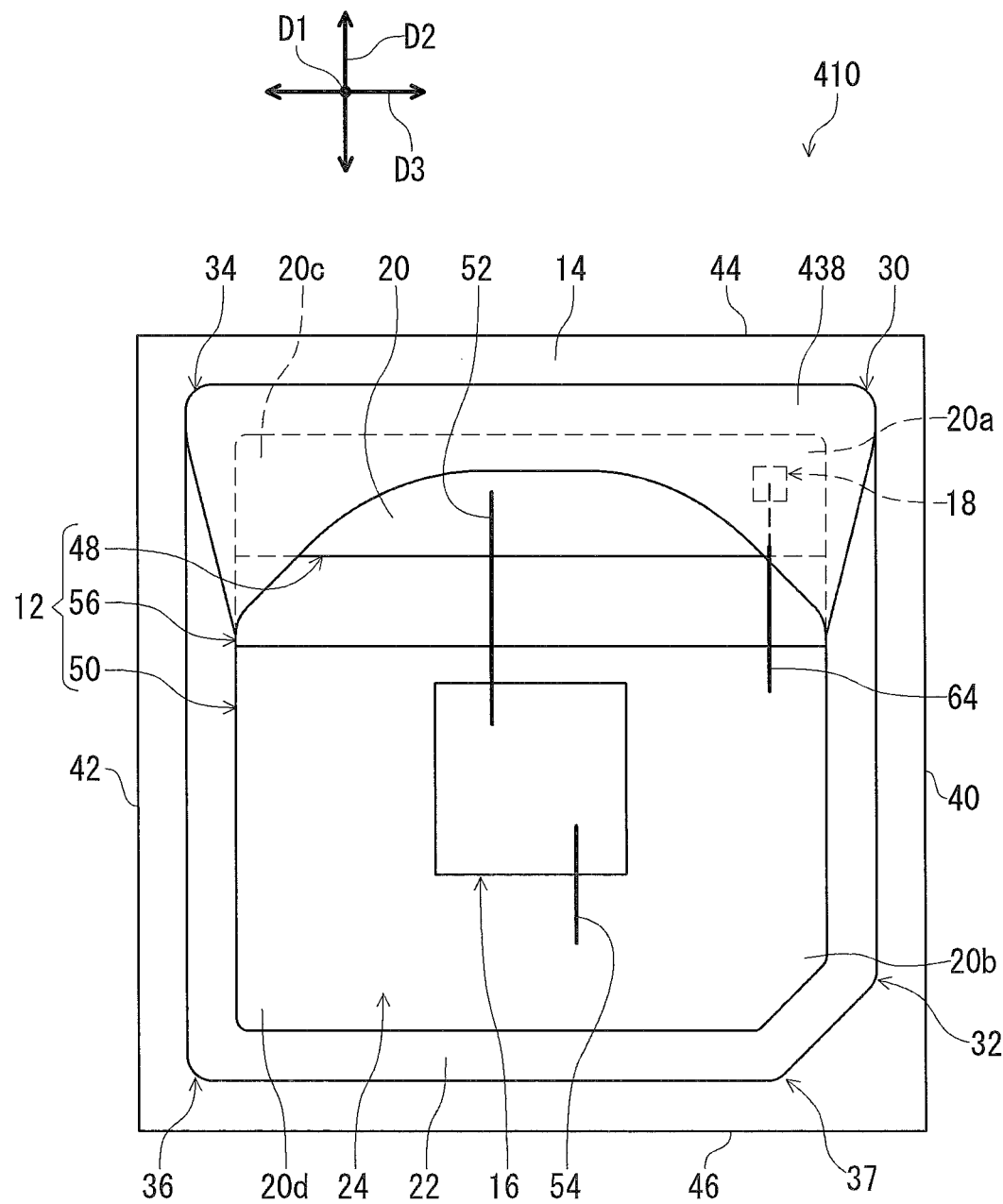
FIG. 8 is a plan view of a light emitting device in accordance with a fourth embodiment.

As seen in FIG. 8, the light emitting device 410 includes a light reflective portion 438. The light reflective portion 438 covers the protection element 18 to reflect light emitted from the light emitting element 16. In the illustrated embodiment, the light reflective portion 438 entirely covers the protection element 18 to reflect light emitted from the light emitting element 16.

The light reflective portion 438 has substantially the same construction as the construction of the light reflective portion 38 in accordance with the first embodiment. Specifically, the light reflective portion 438 of the present embodiment covers the first area 20a and has a cross-sectional shape substantially equal to that of the light reflective portion 38 in the first embodiment (FIG. 5). In the illustrated embodiment, however, the light reflective portion 438 covers at least one of the second area 20b, the third area 20c, and the fourth area 20d. Specifically, the light reflective portion 438 of the present embodiment covers the third area 20c in addition to the first area 20a. Also, the light reflective portion 438 of the present embodiment covers the first area 20a, the third area 20c and a portion of the inner peripheral surface 22 near the fourth side 44 continuously. However, the light reflective portion 438 can be separate parts respectively covering the first area 20a and the third area 20c. Also, the light reflective portion 438 can cover a portion of the inner peripheral surface 22 near the first side 40, the second side 42, or the third side 46.

With the light emitting device 410, it is possible to obtain substantially the same advantageous effects as those of the light emitting device 10 in accordance with the first embodiment.

Fifth Embodiment

A light emitting device 510 in accordance with a fifth embodiment will be described below referring to FIG. 9. The light emitting device 510 has the same construction as the light emitting device 10 of the first embodiment except for the light reflective portion 38. Thus, elements having substantially the same function as those in the above embodiments will be numbered the same here, and will not be described and/or illustrated again in detail here for the sake of brevity.

Figure 9:
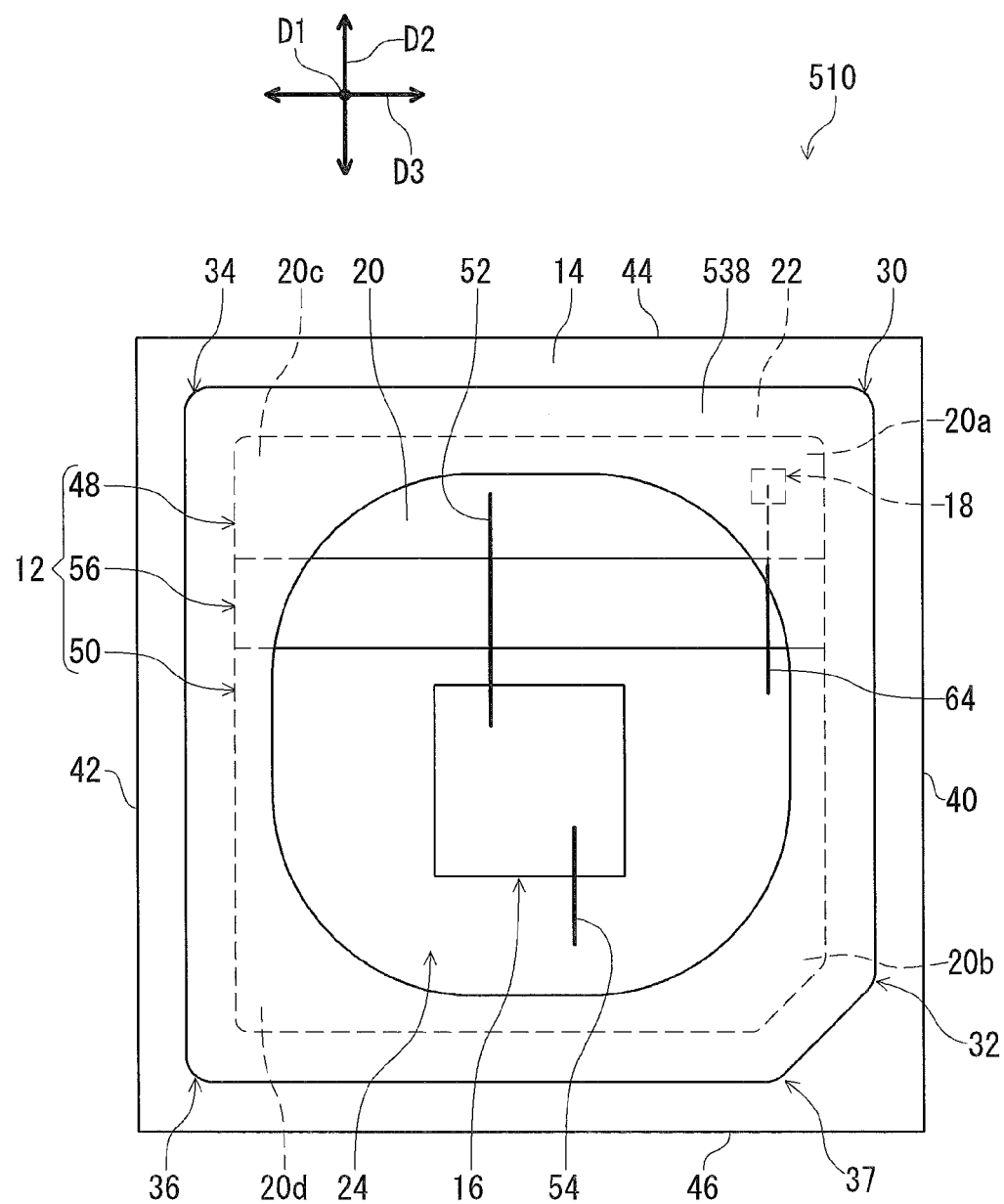
FIG. 9 is a plan view of a light emitting device in accordance with a fifth embodiment.

As seen in FIG. 9, the light emitting device 510 includes a light reflective portion 538. The light reflective portion 538 covers the protection element 18 to reflect light emitted from the light emitting element 16. In the illustrated embodiment, the light reflective portion 538 entirely covers the protection element 18 to reflect light emitted from the light emitting element 16.

The light reflective portion 38 covers the inner peripheral surface 22 to reflect light emitted from the light emitting element 16. In the illustrated embodiment, the light reflective portion 38 entirely covers the inner peripheral surface 22 to reflect light emitted from the light emitting element 16.

The light reflective portion 538 has substantially the same construction as the construction of the light reflective portion 38 in accordance with the first embodiment. Specifically, the light reflective portion 538 covers the first area 20a and has a cross-sectional shape substantially equal to that of the light reflective portion 38 in the first embodiment (FIG. 5). The light reflective portion 538 covers the second area 20b, the third area 20c, and the fourth area 20d in addition to the first area 20a. The light reflective portion 538 can be separate parts respectively covering the first area 20a, the second area 20b, the third area 20c, and the fourth area 20d.

With the light emitting device 510, it is possible to obtain substantially the same advantageous effects as those of the light emitting device 10 in accordance with the first embodiment.

Sixth Embodiment

A light emitting device 610 in accordance with a sixth embodiment will be described below referring to FIG. 10. The light emitting device 610 has the same construction as the light emitting device 10 except for the second corner 32. Thus, elements having substantially the same function as those in the above embodiments will be numbered the same here, and will not be described and/or illustrated again in detail here for the sake of brevity.

Figure 10:
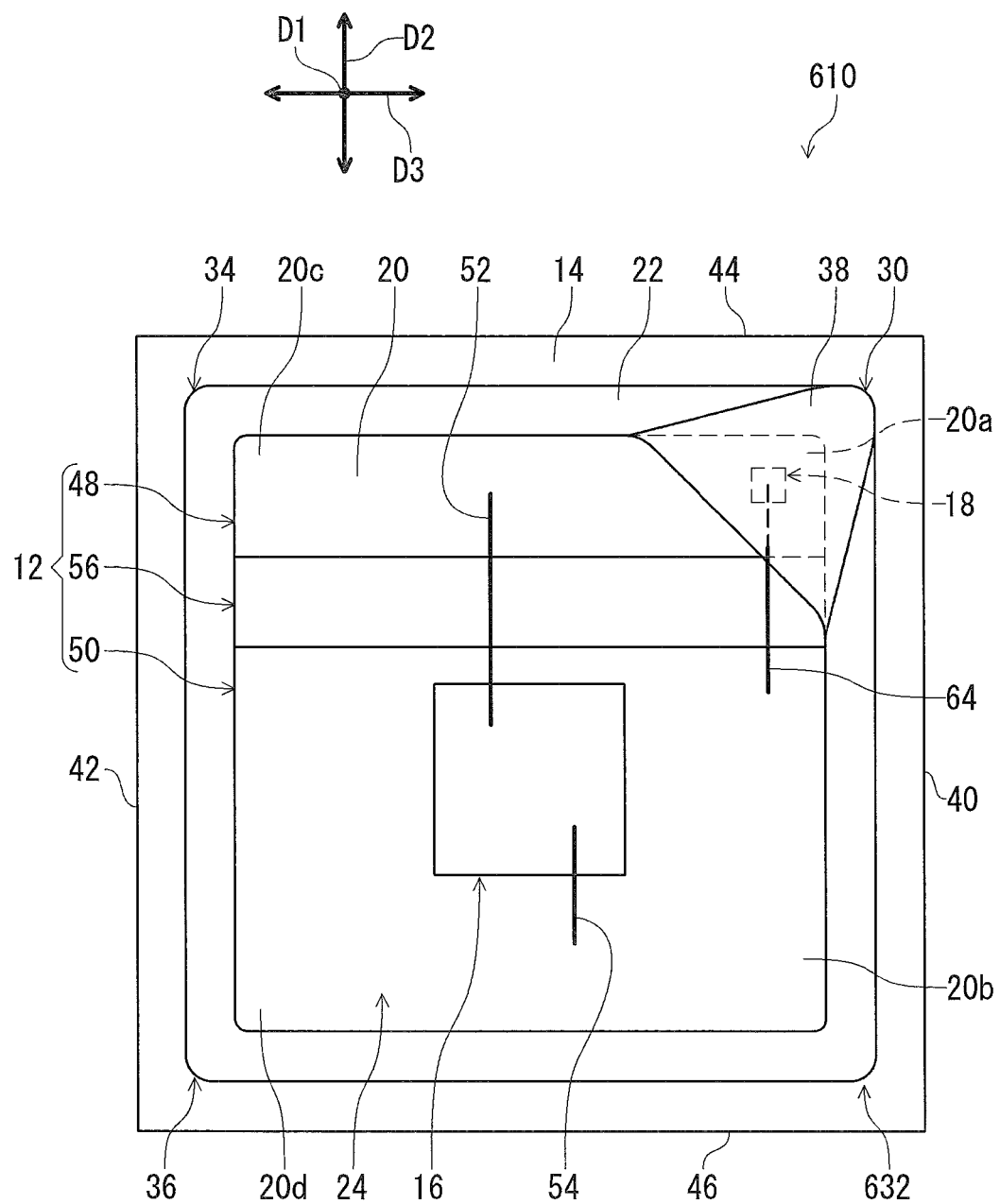
FIG. 10 is a plan view of a light emitting device in accordance with a sixth embodiment.

As seen in FIG. 10, in the light emitting device 610, the substantially polygonal shape of the opening 24 includes the first corner 30, a second corner 632, the third corner 34, and the fourth corner 36. Unlike the light emitting device 10 in accordance with the first embodiment, the opening 24 has a substantially square shape. The second corner 632 has a shape equal to the first corner 30, the third corner 34, and the fourth corner 36. The second corner 632 forms a right angle and has a round shape. The fifth corner 37 is omitted from the substantially polygonal shape of the opening 24.

With the light emitting device 610, it is possible to obtain substantially the same advantageous effects as those of the light emitting device 10 in accordance with the first embodiment.

Seventh Embodiment

A light emitting device 710 in accordance with a seventh embodiment will be described below referring to FIGS. 11 and 12. The light emitting device 710 has the same construction as the light emitting device 10 except for the light reflective portion 38. Thus, elements having substantially the same function as those in the above embodiments will be numbered the same here, and will not be described and/or illustrated again in detail here for the sake of brevity.

Figure 11:
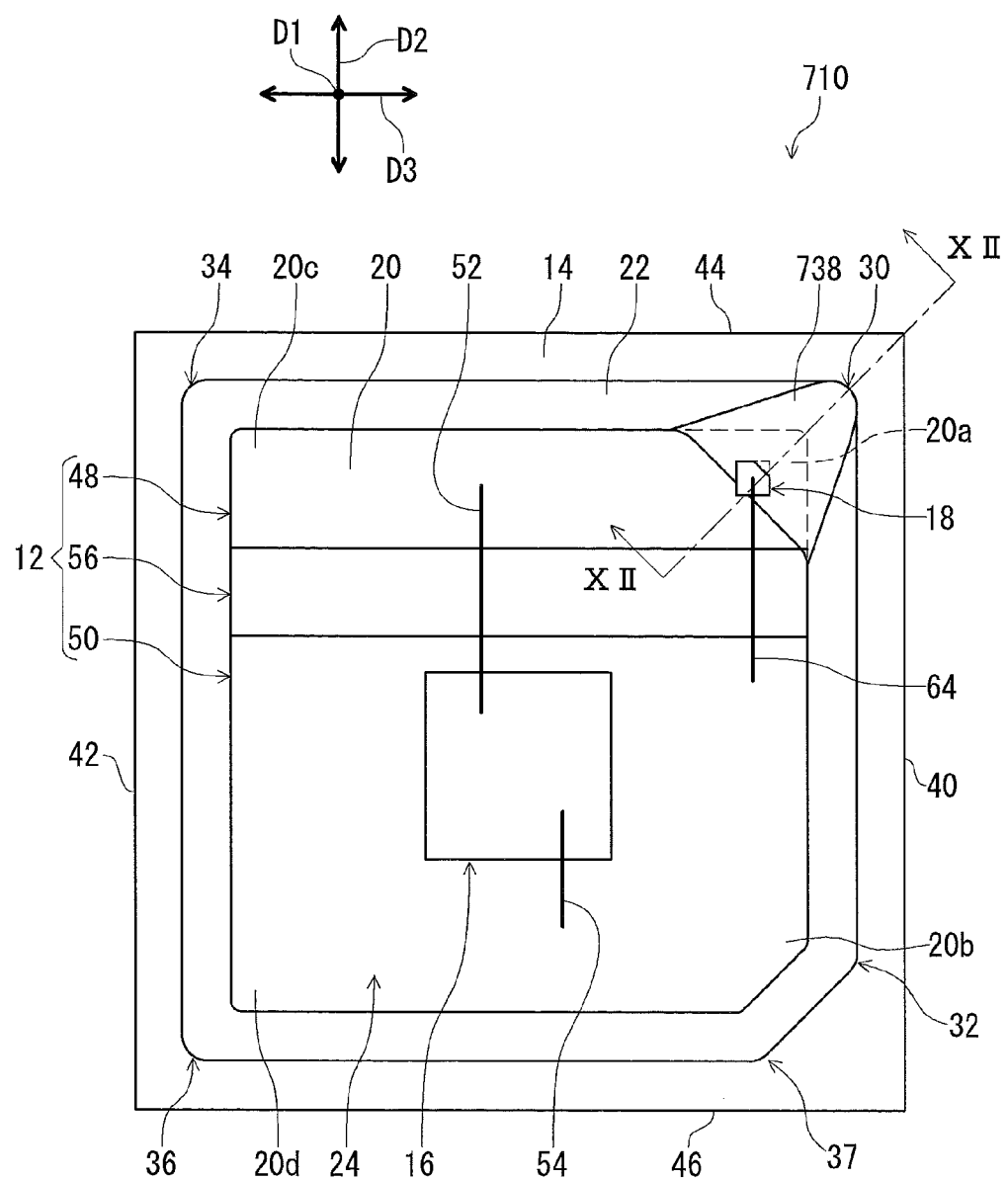
FIG. 11 is a plan view of a light emitting device in accordance with a seventh embodiment.
Figure 12:
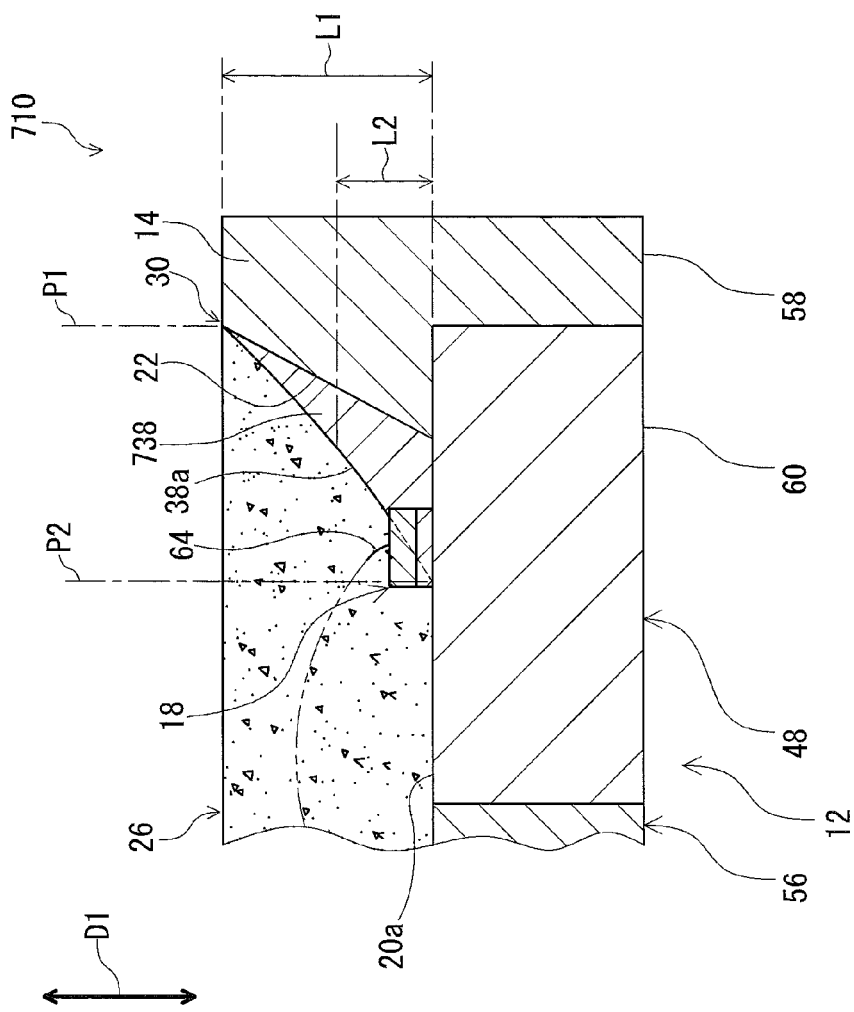
FIG. 12 is a partial cross-sectional view of the light emitting device taken along line XII-XII of FIG. 11.

As seen in FIG. 11, the light emitting device 710 includes a light reflective portion 738. The light reflective portion 738 covers the protection element 18 to reflect light emitted from the light emitting element 16. In the illustrated embodiment, the light reflective portion 738 partially covers the protection element 18 to reflect light emitted from the light emitting element 16. The light reflective portion 738 partially covers the inner peripheral surface 22 of the wall 14. As seen in FIG. 12, the light reflective portion 738 has a cross-sectional shape substantially equal to that of the light reflective portion 38 in the first embodiment (FIG. 5). A wire connected to the protective element 18 is exposed from the light reflective portion 738.

With the light emitting device 710, it is possible to obtain substantially the same advantageous effects as those of the light emitting device 10 in accordance with the first embodiment.

Eighth Embodiment

A light emitting device 810 in accordance with an eighth embodiment will be described below referring to FIG. 13. The light emitting device 810 has the same construction as the light emitting device 10 of the first embodiment except for the shape of the base structure 12. Thus, elements having substantially the same function as those in the above embodiments will be numbered the same here, and will not be described and/or illustrated again in detail here for the sake of brevity.

Figure 13:
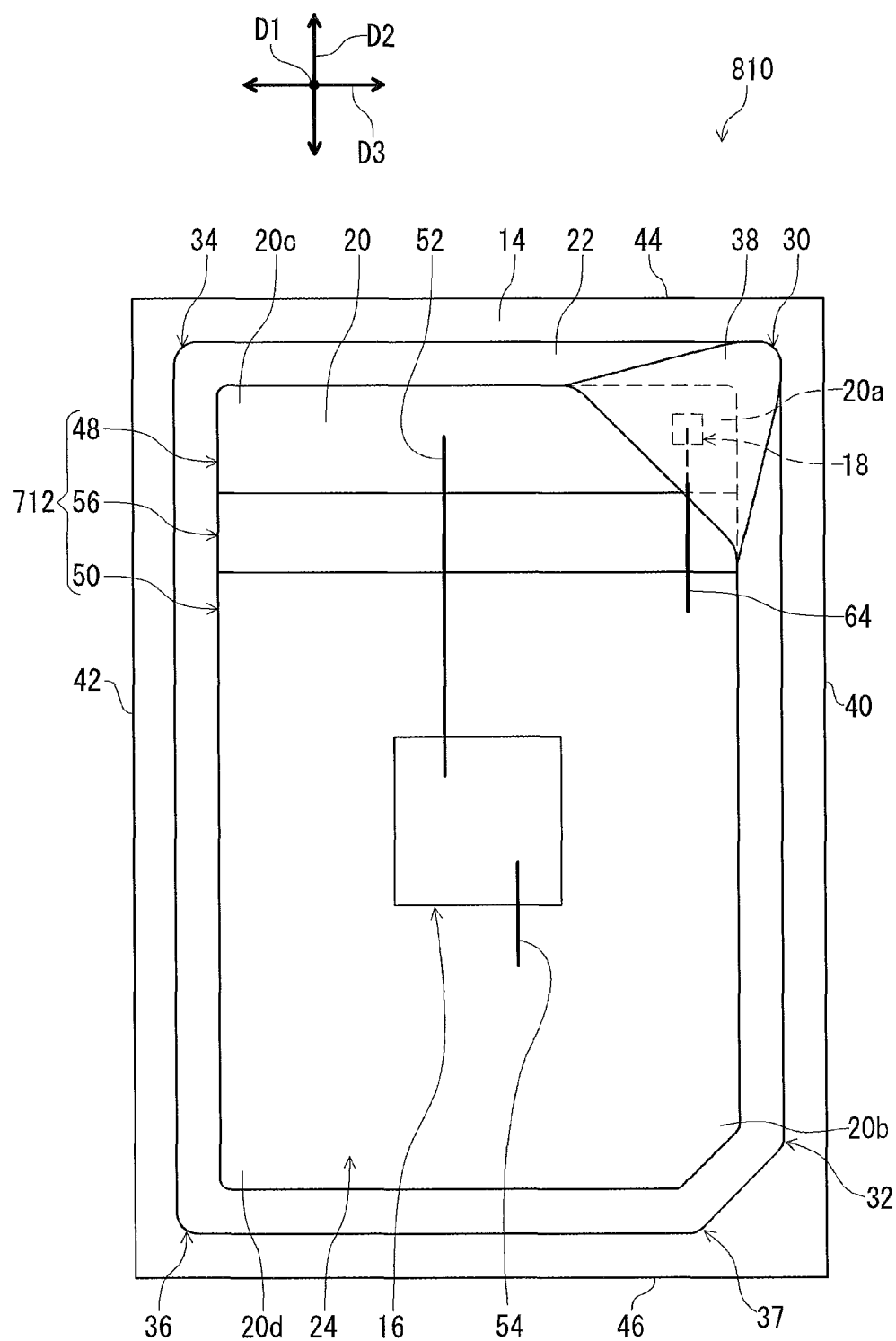
FIG. 13 is a plan view of a light emitting device in accordance with an eighth embodiment.

As seen in FIG. 13, the light emitting device 810 includes a base structure 812. The base structure 812 has substantially the same structure as that of the base structure 12 of the first embodiment. In this embodiment, however, the base structure 812 has a rectangular shape in the planar view.

With the light emitting device 810, it is possible to obtain substantially the same advantageous effects as those of the light emitting device 10 in accordance with the first embodiment.

It will be apparent to those skilled in the technical field of the light emitting device from the present disclosure that the constructions of the above embodiments can be at least partially combined with each other. For example, at least one of the constructions of the light emitting devices 310, 410, 510, and 610 in accordance with the third to sixth embodiments can be applied to the light emitting device 210 in accordance with the second embodiment. At least one of the constructions of the light emitting devices 410, 510, and 610 in accordance with the fourth to sixth embodiments can be applied to the light emitting device 310 in accordance with the third embodiment. The constructions of the light emitting devices 310 in accordance with the third embodiment can be applied to the light emitting device 710 in accordance with the seventh embodiment. At least one of the constructions of the light emitting devices 210, 310, 410, 510, 610, and 710 in accordance with the second to seventh embodiments can be applied to the light emitting device 810 in accordance with the eighth embodiment.

In the present application, the term "comprising" and its derivatives, as used herein, are intended to be open ended terms that specify the presence of the stated features, elements, components, groups, integers, and/or steps, but do not exclude the presence of other unstated features, elements, components, groups, integers and/or steps. This concept also applies to words of similar meaning, for example, the terms "have", "include" and their derivatives.

The terms "member", "section", "portion", "part", "element", "body" and "structure" when used in the singular can have the dual meaning of a single part or a plurality of parts.

The ordinal numbers such as "first" and "second" recited in the present application are merely identifiers, but do not have any other meanings, for example, a particular order and the like. Moreover, for example, the term "first element" itself does not imply an existence of "second element", and the term "second element" itself does not imply an existence of "first element."

The term "pair of" as used herein, can encompass the configuration in which the pair of elements have different shapes or structures from each other in addition to the configuration in which the pair of elements have the same shapes or structures as each other.

Finally, terms of degree such as "substantially", "about" and "approximately" as used herein mean a reasonable amount of deviation of the modified term such that the end result is not significantly changed.

Obviously, numerous modifications and variations of the present invention are possible in light of the above teachings. It is therefore to be understood that within the scope of the appended claims, the invention may be practiced otherwise than as specifically described herein.

What is claimed is:

1. A light emitting device comprising:
a base structure including a first surface;
a wall provided on the first surface of the base structure, the wall including an inner peripheral surface defining an opening, the opening having a substantially polygonal shape in a planar view of the light emitting device, the substantially polygonal shape including a first corner, a second corner, a third corner, and a fourth corner;
a light emitting element provided in the opening in the planar view and provided on the first surface;
a protection element provided in the opening in the planar view and provided on the first surface, the protection element being closer to the first corner than to each of the second corner, the third corner, and the fourth corner in the planar view; and
a light reflective portion covering the protection element, the light reflective portion being provided on the first surface, the light reflective portion having a maximum length which is defined from the first surface in a first direction and which is longest in the light reflective portion, the first direction being substantially perpendicular to the first surface, the maximum length being defined at a maximum-length position closest to the first corner among a plurality of positions defined in the light reflective portion, the light reflective portion having a minimum length which is defined from the first surface in the first direction and which is shortest in the light reflective portion, the minimum length being defined at a minimum-length position arranged apart from the maximum-length position, the light reflective portion including an inclined surface extending from the maximum-length position to the minimum-length position.

2. The light emitting device according to claim 1, wherein the light reflective portion entirely covers the protection element.

3. The light emitting device according to claim 1, wherein the light reflective portion partially covers the protection element.

4. The light emitting device according to claim 1, wherein the light reflective portion covers the inner peripheral surface.

5. The light emitting device according to claim 4, wherein the light reflective portion entirely covers the inner peripheral surface.

6. The light emitting device according to claim 4, wherein the light reflective portion partially covers the inner peripheral surface.

7. The light emitting device according to claim 1, wherein the first surface includes a first area adjacent to the first corner, and
the light reflective portion covers the first area.

8. The light emitting device according to claim 7, wherein the first surface includes
  a second area adjacent to the second corner,
  a third area adjacent to the third corner, and
  a fourth area adjacent to the fourth corner, and
the light reflective portion covers at least one of the second area, the third area, and the fourth area.

9. The light emitting device according to claim 1, wherein the base structure has a substantially square shape in the planar view,
the substantially square shape includes
  a first side extending in a second direction perpendicular to the first direction,
  a second side extending in the second direction and being opposite to the first side in a third direction perpendicular to each of the first direction and the second direction,
  a third side extending in the third direction between the first side and the second side, and
  a fourth side extending in the third direction between the first side and the second side, the fourth side being opposite to the third side in the second direction,
the protection element is closer to the first side than to the second side in the third direction in the planar view, and
the protection element is closer to the third side than to the fourth side in the second direction in the planar view.

10. The light emitting device according to claim 1, wherein
the base structure includes
  a first electrode electrically connected to the light emitting element, and
  a second electrode electrically connected to the light emitting element and spaced apart from the first electrode in a second direction perpendicular to the first direction, and
the first electrode and the second electrode define the first surface.

11. The light emitting device according to claim 10, wherein
the protection element is provided on the first electrode, and
the light emitting element is provided on the second electrode.

12. The light emitting device according to claim 10, wherein
the light reflective portion covers the first electrode.

13. The light emitting device according to claim 10, wherein
the base structure includes a base portion in which each of the first electrode and the second electrode is partially embedded, and
the base portion, the first electrode, and the second electrode define the first surface.

14. The light emitting device according to claim 1, further comprising:
an additional light emitting element provided in the opening in the planar view, wherein
the protection element is closer to the first corner than each of the light emitting element and the additional light emitting element in the planar view.

15. The light emitting device according to claim 1, wherein
the light reflective portion is made of a first material,
the wall is made of a second material, and
the first material has a reflectance substantially equal to a reflectance of the second material.

16. The light emitting device according to claim 1, wherein
the second corner has a shape different from a shape of each of the first corner, the third corner, and the fourth corner.

17. The light emitting device according to claim 16, wherein
the light emitting element is closer to the second corner than the protection element in the planar view.

18. The light emitting device according to claim 16, wherein
the base structure has a substantially square shape in the planar view,
the substantially square shape includes
  a first side extending in a second direction perpendicular to the first direction, and
  a second side extending in the second direction and being opposite to the first side in a third direction perpendicular to each of the first direction and the second direction,
the protection element is closer to the first side than to the second side in the third direction in the planar view, and
the second corner is closer to the first side than to the second side in the third direction in the planar view.

19. The light emitting device according to claim 16, wherein
the base structure has a substantially square shape in the planar view,
the substantially square shape includes
  a first side extending in a second direction perpendicular to the first direction, and a second side extending in the second direction and being opposite to the first side in a third direction perpendicular to each of the first direction and the second direction, the protection element is closer to the second side than to the first side in the third direction in the planar view, and the second corner is closer to the first side than to the second side in the third direction in the planar view.

20. The light emitting device according to claim 16, further comprising:
an additional light emitting element provided in the opening in the planar view, wherein
the protection element is closer to the first corner than each of the light emitting element and the additional light emitting element in the planar view.

21. The light emitting device according to claim 20, wherein
at least one of the light emitting element and the additional light emitting element is closer to the second corner than the protection element in the planar view.

22. The light emitting device according to claim 21, wherein
the light emitting element is offset from the additional light emitting element in the planar view.

23. The light emitting device according to claim 1, further comprising:
a sealing member filled in the opening to cover the light emitting element.

24. The light emitting device according to claim 1, wherein
the light reflective portion has a minimum length which is defined from the first surface in the first direction and which is shortest in the light reflective portion,
the minimum length is defined at a minimum-length position arranged apart from the maximum-length position,
the light reflective portion has a length defined in the first direction, and
the length of the light reflective portion gradually decreases from the maximum-length position to the minimum-length position.

25. The light emitting device according to claim 1, wherein
the maximum length is equal to a height of the wall defined in the first direction.

26. The light emitting device according to claim 1, wherein
the minimum length is zero.

27. The light emitting device according to claim 1, further comprising:
a conductive wire electrically connected to the protection element and is partially covered with the light reflective member.

28. A light emitting device comprising:
a base structure including a first surface;
a wall provided on the first surface of the base structure, the wall including an inner peripheral surface defining an opening, the opening having a substantially polygonal shape in a planar view of the light emitting device, the substantially polygonal shape including a first corner, a second corner, a third corner, and a fourth corner, the second corner having a shape different from a shape of each of the first corner, the third corner, and the fourth corner;
a light emitting element provided in the opening in the planar view;

a protection element provided in the opening in the planar view; and
a light reflective portion covering the protection element to reflect light emitted from the light emitting element, the light reflective portion having a maximum length which is defined from the first surface in the first direction and which is longest in the light reflective portion, the maximum length being defined at a position closest to the first corner among a plurality of positions defined in the light reflective portion,
the light reflective portion having a minimum length which is defined from the first surface in the first direction and which is shortest in the light reflective portion, the minimum length being defined at a minimum-length position arranged apart from the maximum-length position, the light reflective portion including an inclined surface extending from the maximum-length position to the minimum-length position.

29. The light emitting device according to claim 28, wherein
the light reflective portion entirely covers the protection element.

30. The light emitting device according to claim 28, wherein
the light reflective portion partially covers the protection element.

31. The light emitting device according to claim 28, wherein
the light reflective portion covers the inner peripheral surface.

32. The light emitting device according to claim 31, wherein
the light reflective portion entirely covers the inner peripheral surface.

33. The light emitting device according to claim 31, wherein
the light reflective portion partially covers the inner peripheral surface.

34. The light emitting device according to claim 28, wherein
the second corner has a chamfered shape.

35. The light emitting device according to claim 28, wherein
the light emitting element is closer to the second corner than the protection element in the planar view.

36. The light emitting device according to claim 28, wherein
the base structure has a substantially square shape in the planar view,
the substantially square shape includes
a first side extending in a second direction perpendicular to the first direction, and
a second side extending in the second direction and being opposite to the first side in a third direction perpendicular to each of the first direction and the second direction,
the protection element is closer to the first side than to the second side in the third direction in the planar view, and
the second corner is closer to the first side than to the second side in the third direction in the planar view.

37. The light emitting device according to claim 28, wherein
the base structure has a substantially square shape in the planar view,
the substantially square shape includes
a first side extending in a second direction perpendicular to the first direction, and a second side extending in the second direction and being opposite to the first side in a third direction perpendicular to each of the first direction and the second direction, the protection element is closer to the second side than to the first side in the third direction in the planar view, and the second corner is closer to the first side than to the second side in the third direction in the planar view.

38. The light emitting device according to claim 28, wherein the base structure includes
a first electrode electrically connected to the light emitting element, and
a second electrode electrically connected to the light emitting element and spaced apart from the first electrode in a second direction perpendicular to the first direction, the first electrode and the second electrode define the first surface, the protection element is provided on the first electrode, the light emitting element is provided on the second electrode, and the second corner is closer to the second electrode than the first corner in the planar view.

39. The light emitting device according to claim 38, wherein the base structure includes a base portion in which each of the first electrode and the second electrode is partially embedded, and the base portion, the first electrode, and the second electrode define the first surface.

40. The light emitting device according to claim 28, wherein the light reflective portion is made of a first material,
the wall is made of a second material, and
the first material has a reflectance substantially equal to a reflectance of the second material.

41. The light emitting device according to claim 28, further comprising:

a sealing member filled in the opening to cover the light emitting element.

42. The light emitting device according to claim 28, wherein the light reflective portion has a minimum length which is defined from the first surface in the first direction and which is shortest in the light reflective portion, the minimum length is defined at a minimum-length position arranged apart from the maximum-length position, the light reflective portion has a length defined in the first direction, and the length of the light reflective portion gradually decreases from the maximum-length position to the minimum-length position.

* * * * *